United States Patent [19]
Cesari

[11] Patent Number: 5,844,947
[45] Date of Patent: Dec. 1, 1998

[54] VITERBI DECODER WITH REDUCED METRIC COMPUTATION

[75] Inventor: Richard Adam Cesari, Annondale, N.J.

[73] Assignee: Lucent Technologies Inc., Murray Hill, N.J.

[21] Appl. No.: 772,612

[22] Filed: Dec. 23, 1996

Related U.S. Application Data

[60] Provisional application No. 60/009,537 Dec. 29, 1995.

[51] Int. Cl.[6] ............................. H03D 1/00; H04L 27/06
[52] U.S. Cl. ........................ 375/341; 375/262; 375/209; 375/210
[58] Field of Search ................................... 375/341, 262, 375/209, 210, 263

[56] References Cited

U.S. PATENT DOCUMENTS

| | | | |
|---|---|---|---|
| 4,493,082 | 1/1985 | Cumberton et al. | 371/43 |
| 4,536,878 | 8/1985 | Rattlingourd et al. | 371/43 |
| 4,583,078 | 4/1986 | Shenoy et al. | 340/347 |
| 4,606,027 | 8/1986 | Otani | 371/43 |
| 4,748,626 | 5/1988 | Wong | 371/30 |
| 5,113,400 | 5/1992 | Gould et al. | 371/43 |
| 5,134,635 | 7/1992 | Hong et al. | 375/94 |
| 5,202,903 | 4/1993 | Okanoue | 375/100 |
| 5,272,706 | 12/1993 | Park | 371/43 |
| 5,280,472 | 1/1994 | Gilhousen et al. | 370/18 |
| 5,309,474 | 5/1994 | Gilhousen et al. | 375/1 |
| 5,371,471 | 12/1994 | Chennakeshu et al. | 329/304 |
| 5,416,797 | 5/1995 | Gilhousen et al. | 370/209 |
| 5,442,627 | 8/1995 | Viterbi et al. | 370/22 |
| 5,550,868 | 8/1996 | Boccuzzi | 375/330 |
| 5,581,575 | 12/1996 | Zehavi et al. | 375/200 |
| 5,581,581 | 12/1996 | Sato | 375/341 |
| 5,602,833 | 2/1997 | Zehavi | 370/209 |
| 5,615,227 | 3/1997 | Schumacher, Jr. et al. | 375/206 |
| 5,715,236 | 2/1998 | Gilhousen et al. | 370/209 |

OTHER PUBLICATIONS

IEEE Journal on Selected Areas in Communications, vol. SAC–2, No. 4, Jul. 1984 "The Effects of Multipath and Fading on the Performance of Direct–Sequences CDMA Systems" by George L. Turin, pp. 597–603.
Wireless and Mobile Communications edited by Jack M. Holtzman and David J. Goodman, Kluwer Academic Publishers 1994, "Multiuser Detection and Diversity Combining For Wireless CDMA Systems" by Zoran Zvonar, Woods Hole Oceanographic Institution, Woods Hole, MA 02543, U.S.A., pp. 51–65.

Primary Examiner—Stephen Chin
Assistant Examiner—Muhammad Ghayour
Attorney, Agent, or Firm—David L. Smith

[57] ABSTRACT

There is disclosed a method and apparatus for computing branch metrics that are combinations of autocorrelation and cross correlation terms are constructed by first calculating and storing components of the autocorrelation and cross correlation terms at a symbol instant. Once calculated and stored, predetermined ones of the autocorrelation components and the cross correlation components are selected. The selected autocorrelation components and cross correlation components, or their inverse as predetermined, are combined to produce a branch metric. Other predetermined combinations of the stored components of autocorrelation and cross correlation terms, or their inverse, are combined to produce other branch metrics at the same symbol instant. All branch metrics associated with the symbol instant can be calculated in this manner. The components of the autocorrelation terms and cross correlation terms associated with the next symbol instant are calculated and stored, and the process of generating the branch metrics repeated.

21 Claims, 4 Drawing Sheets

VITERBI DECODER WITH REDUCED METRIC COMPUTATION

This application claims priority of provisional application No. 60/009337 filed Dec. 29, 1995.

TECHNICAL FIELD

This invention relates generally to viterbi decoders such as would be used in digital receivers, and particularly to a viterbi decoder with reduced metric computations.

BACKGROUND OF THE INVENTION

Although telecommunications technology originally developed using copper wires as the transmission media, today there is much interest and commercial activity in wireless technology using free space as the transmission media. Wireless technology frees the user from the constraint of needing a physical connection to the transmission media.

Initial commercial activity developing wireless technology used analog transmission technology. In the interest of increasing efficiency of spectrum utilization, digital transmission systems have been developed. One digital standard (Group Special Mobile, or GSM) has been adopted for use in Europe. A different standard (IS54) will likely be adopted for use in North America: either a time-division multiple access (TDMA) standard, or a competing code-division multiple access (CDMA) standard. Other parts of the world such as Japan are considering yet another digital standard, such as the Japan Digital Standard.

Digital systems transmit information either as zeros or ones. While accurate transmission of information is generally not at issue, accurate detection of information received depends on being able to detect transmitted ones as ones upon being received, and being able to detect transmitted zeros as zeros upon being received. Accurate detection is not a simple matter due to many factors. These factors include low received signal power at a receiver, movement of the transmitter relative to the receiver which introduces changing channel characteristics. Multi-path interference, or inter-symbol interference, occurs when reflections from various objects, including atmospheric layers, cause the presence of multiple transmission paths from the transmitter to the receiver, with varying transit times for a transmitted signal, causing several images of a transmitted signal to arrive at the receiver at different instants in time.

Error correction techniques have been developed to increase accuracy of digital communication systems. A viterbi decoder is a maximum likelihood decoder that provides forward error correction. Viterbi decoders are used to decode a sequence of encoded symbols, such as a bit stream. The bit stream can represent encoded information in a telecommunications system. Such encoded information can be transmitted through various media with each bit (or set of bits) representing a symbol instant. In the decoding process, a viterbi decoder works back through a sequence of possible received bit sequences at each symbol instant to determine which one bit sequence was most likely to have been transmitted. The possible transition from a bit at one symbol instant, or state, to a bit at a next or a subsequent symbol instant or state, is limited. Each possible transition from one state to a next state can be shown graphically and is defined as a branch. All possible branches constitute a trellis. A sequence of interconnected branches is defined as a path. Each state can transition only to a limited number (for example two or four) of next states upon receipt of the next bit (or set of bits) in the bit branch. Thus, some paths survive and other paths do not survive during the decoding process. By eliminating those transitions that are not permissible, computation efficiency can be achieved in determining the most likely paths to survive. The viterbi decoder typically defines and calculates a branch metric associated with each branch and employs this branch metric to determine which paths survive and which paths do not survive.

A branch metric is calculated at each symbol instant for each possible branch. Each path has an associated metric, accumulated cost, that is updated at each symbol instant. For each possible transmission, the accumulated cost for the next state is calculated as the extremum of the sum of the branch metric for the possible transmission and the path accumulated cost at the respective previous, or originating, state. Calculation at each symbol instant of the branch metric involves an add, compare and select operation for each state. This can result in computation-intensive operation.

A need remains in the art for an efficient way to calculate the branch metrics that substantially reduces the number of calculations and concomitantly reduces the power and time consumed in the calculation of branch metrics.

SUMMARY OF THE INVENTION

In accordance with the invention, a method and apparatus for generating branch metrics that are combinations of autocorrelation and cross correlation terms are constructed by first calculating and storing components of the autocorrelation and cross correlation terms at a symbol instant. Once calculated and stored, predetermined ones of the autocorrelation components and the cross correlation components are selected. The selected autocorrelation components and cross correlation components, or their inverse as predetermined, are combined to produce a branch metric. Other predetermined combinations of the stored components of autocorrelation and cross correlation terms, or their inverse, are combined to produce other branch metrics at the same symbol instant. All branch metrics associated with the symbol instant can be calculated in this manner. The components of the autocorrelation terms and cross correlation terms associated with the next symbol instant are calculated and stored, and the process of generating the branch metrics repeated.

BRIEF DESCRIPTION OF THE DRAWINGS

The invention will now be described by way of example in which.

DETAILED DESCRIPTION

Figure 1:
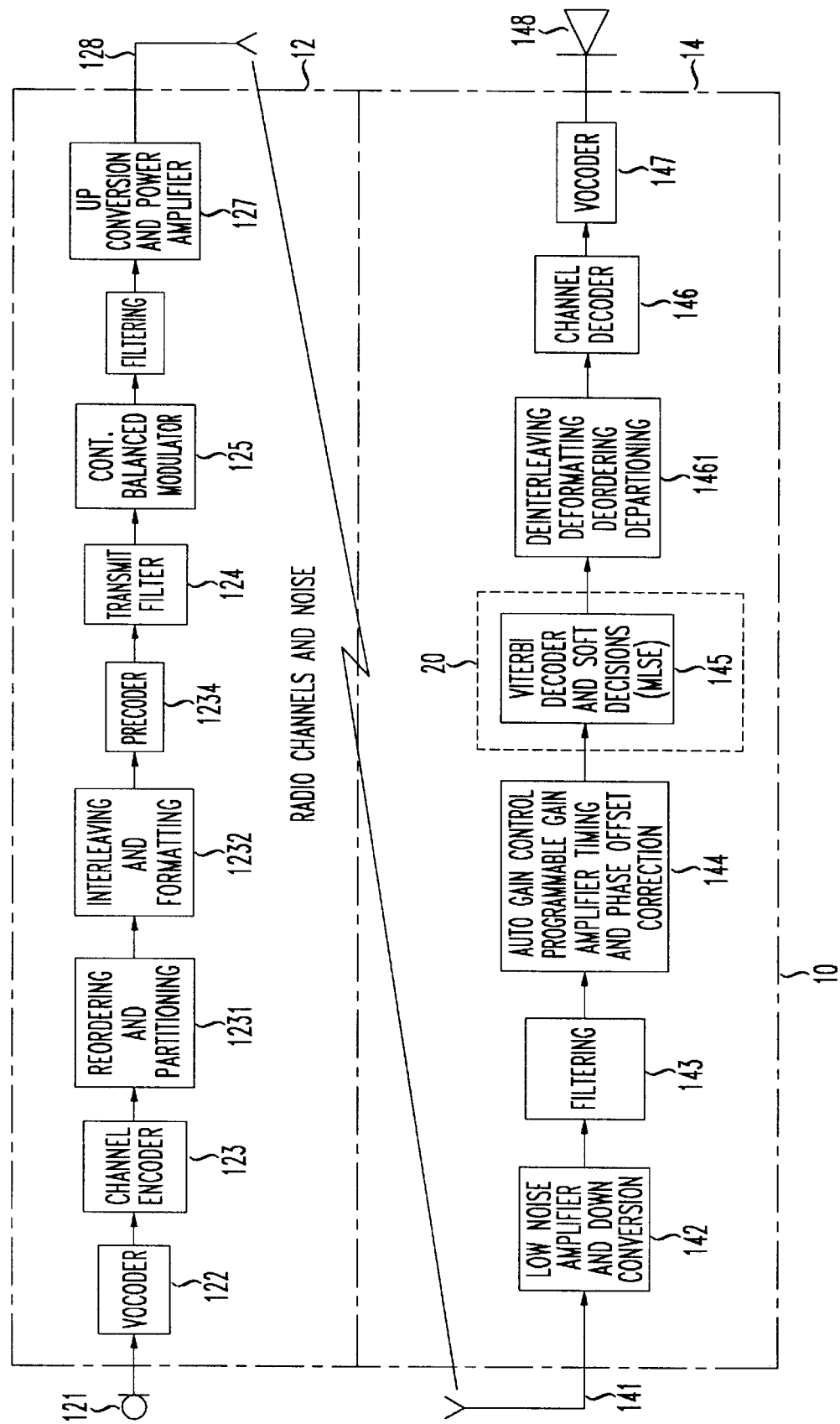
FIG. 1 is a block diagram of a transceiver, in accordance with an illustrative embodiment of the present invention.

Transceiver 10 shown in the block diagram of FIG. 1 is an illustrative embodiment of the invention. Transceiver 10 is a communication system or portion of a communication system such as a mobile digital cellular telephone. Transceiver 10 is comprised of transmitter 12 and receiver 14.

As shown in FIG. 1, a microphone 121 for converting a voice signal into an electrical signal is coupled to a vocoder 122. The vocoder is coupled to the channel encoder 123, which includes reordering and partitioning 1231, interleaving and formatting 1232, and symbol converter 1234. The output of the channel encoder is coupled to a transmitter filter 124. The filter output is coupled to a continuous balanced modulator 125, which in turn is coupled to another filter 126. Filter 126 is coupled to an up converter and power amplifier 127 which is turn is coupled to an antenna 128.

On the receiver side, antenna 141 is coupled to a low noise amplifier and down conversion 142, which is coupled to filtering 143. Filtering 143 is coupled to automatic gain control 144 which conditions the signal for input to the Viterbi decoder 145. The Viterbi decoder is coupled to a channel decoder 146 which includes deinterleaving, deformatting, deordering and departitioning 1461. The channel decoder is coupled to a vocoder 147. The vocoder is coupled to a speaker 148.

Figure 2:
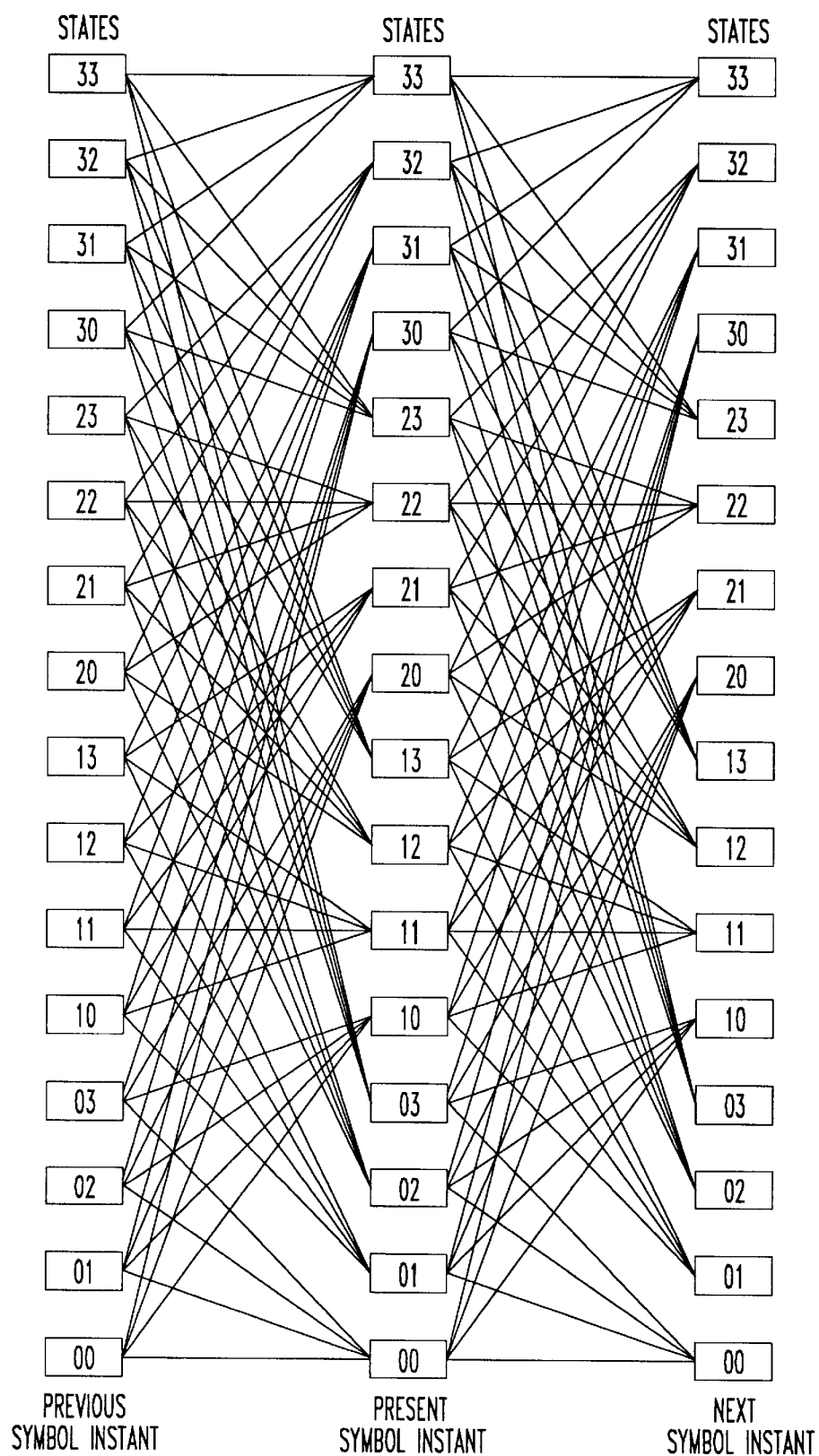
FIG. 2 is a diagram showing three symbol instants and the possible branches among the individual states.

FIG. 2 shows a trellis diagram useful in understanding the branch metrics used in a Viterbi decoder. A Viterbi decoder reconstructs a transmitted bit stream from a received bit stream. Perfect digital signal symbols in a sequence are transmitted. However, the received signal is distorted due to noise and interference. As the mobile digital cellular telephone moves through its environment, the characteristics of the channel over which the signals are transmitted and received change. At each state or symbol instant (shown horizontally), there are a number of states (shown vertically) that range from zero up to $4^{C-1}-1$ where C is the constraint length. These $4^{C-1}$ states are referred to as individual states. The portion of a trellis diagram shown in FIG. 2 is constructed one symbol instant at a time, as is known in the art. The trellis entries at each symbol instant comprise a cell. At each symbol instant, each individual state of the illustrative embodiment shown in FIG. 2 can only transition to four possible individual states at the next symbol instant. Concomitantly, each individual state at a symbol instant has only four possible previous individual states from which a transition to it can originate. Other decoders could have more or less than four transitions from a previous state and to a next state.

A branch metric is calculated at each symbol instant for each possible transition from an individual state at one symbol instant, known as a source state, to an individual state at the next symbol instant. Various methods for calculating branch metrics are known in the art. The branch metric of all branches transitioning to a given next individual state are calculated, then added to the accumulated cost of the respective originating individual state. This results in four potential accumulated cost sums. A comparison is made of the four potential accumulated cost sums. An extremum branch metric, such as the least of the four sums, is selected as the next state accumulated cost. A transition corresponding to the least sum is the most likely transition from the four possible originating individual states to the given next individual state. The surviving branch data of the most likely transition is stored forming the trellis of FIG. 2 as the surviving branch to the given next individual state as is known in the art. The extremum branch metric is the accumulated cost of the next individual state. This process is repeated for each of the next individual states and repeated also for each symbol instant in the sequence.

Accumulated cost and the source state for the selected branch can be stored in an array. When the trellis is complete, a decoded symbol at each symbol instant can be obtained by a traceback operation. Starting with the individual state in the last symbol instant having the minimum associated accumulated cost, a single trace back through the trellis will provide a decoded symbol at each symbol instant. At each symbol instant of this traceback operation, the source state is translated into a decoded symbol for that symbol instant, as is known in the art.

A viterbi decoder is used with a partial log likelihood estimator to determine the most likely symbol sequence taken from a set of possible sequences over an interval of time. Minimizing the integral squared error between the received sequence and the expected sequence results in the most likely sequence to have been transmitted through a channel. The predicted squared error or log-likelihood between the received signal and an expected sequence for complex functions is the auto correlation of the predicted error functions, multiplied by a constant. The constant may be ignored when evaluating relative likelihoods.

$$\text{log likelihood}_m = \left( \sum_{n=0}^{N-1} y(n) - \sum_{i=0}^{I-1} S(i)_m \cdot h_i(n-ri) \right)^* \left( \sum_{n=0}^{N-1} y(n) - \sum_{i=0}^{I-1} S(i)_m \cdot h_i(n-ri) \right) \quad (1)$$

where:
y(n) is a received sample sequence
S(i) is the predicted symbol at symbol instant or symbol index i
h is a channel estimate, estimated at the symbol rate (with index i)
i is the symbol index
I is the number of symbols in the interval
n is I/r
N is the number of samples in a sequence, N=I/r
m is the metric, or expected value index
r is the number of samples per symbol
* represents a complex conjugate.

Recognizing and taking advantage of conjugate symmetry, and substituting the index j for the index i in the conjugate error factor, the log-likelihood can be rewritten as $$\text{log likelihood}_m = \quad (2)$$

$$\sum_{n=0}^{N-1} y(n)^2 - 2Re \sum_{n=0}^{N-1} y(n) \cdot \sum_{i=0}^{I-1} S(i)^*_m \cdot h(n-ri)^* +$$

$$2Re \sum_{i=0}^{I-1} \sum_{j=i}^{I-1} \sum_{n=0}^{N-1} [S(i)S(j)^*]_m \cdot h(n-ri) \cdot h(n-rj)^*$$

The expected value (the right term in the right bracket of equation (1)) can be considered a sum of partial responses, each of which is equal to $S(i)_m$ multiplied by the channel response h(n) and placed in a time location r·i. For a channel filter, L symbols long, where L is the number of symbols in the channel impulse response, L partial responses overlap. The received signal is processed r samples at a time. The total squared error, which is proportional to the log-likelihood, is the sum of the partial windowed squared error values. For a 4-ary case, each symbol can take on one of four possible values. With three symbols affecting each one-symbol window, each window can have 64 possible partial log-likelihoods. For a rapidly changing channel, it may be necessary to update the channel estimate, h(n), once per symbol.

Equation (2) represents the integral of the signal energy minus the difference between the cross correlation of the expected sequence. The three terms of equation (2) represent energy, cross-correlation, and autocorrelation respectively. Terms not dependent on $S(i)_m$ need not be included when calculating the relative probabilities of the symbol sequences. Such terms include the energy term and the inner products of the autocorrelation term where i=j. It is only necessary to find the sequence which maximizes the absolute value of the difference of the last two terms in the above equation.

The equation for evaluating the partial log-likelihood for a three-tap channel filter, 16-state case are:

$$\log \text{likelihood}_{(m)} =$$

$$S(i-1)_m \cdot y(n)^* \cdot h_{n-1}(k+1) + S(i)_m \cdot y(n)^* \cdot h_n(k) +$$

$$S(i+1)_m \cdot y(n)^* \cdot h_{n+1}(k-1) +$$

$$[S(i-1) \cdot S(i)]_m \cdot h_{n-1}(k+1) \cdot h_n(k+1) +$$

$$[S(i-1)^* \cdot S(i+1)]_m \cdot h_{n-1}(k)^* \cdot h_{(n+1)}(k) +$$

$$[S(i)^* \cdot S(i+1)]_m \cdot h_n(k-1)^* \cdot h_{n+1}(k-1)$$

where:

$h_{(n-1)}(k)$ is the past channel estimate, $h_{(n)}(k)$ is the present channel estimate, and $h_{(n+1)}(k)$ is an approximation of a future channel estimate. When performing the initial timing and channel estimate, a known symbol sequence is compared with the received signal to obtain the most likely channel impulse response. For synchronous detection with the differential quadrature phase shift keying (DQPSK) channel, the known preamble sequence of differential symbols should be first converted into a set of absolute phase values from which an expected value is generated for use in the channel estimation process. The first symbol in the preamble used for the channel estimate should be an even number of symbols back from the first unknown data symbol, and the value of this first phase value prior to the first known symbol used for the channel estimate should be arbitrarily set to zero phase. The DQPSK phase differential symbol values following the first symbol preamble used in the channel estimation, should then be converted to absolute phases accordingly. The phase offset of the first received symbol can then be expected to be one of the even indexed phases $$[2\pi n/8; n \text{ even}]$$

on the unit circle (when using the channel estimate derived from the above-mentioned preample sequence). The expected complex symbol value for the first unknown symbol is then one of the four complex values; 1+0j 0−1j, −1+0j, and 0+1j.

Odd indexed symbols, are expected to be one of four odd phases on the unit circle $$[2\pi n/8; n \text{ odd}]$$

By rotating the odd indexed expect partial responses by −π/4, the MLSE operation remains identical for both even and odd indexed symbols, and eliminates the need for performing a scalar operation for each state in a symbol interval. The −π/4 phase rotation requires calculating the sum and the difference of the real and imaginary value of the expected values and multiplying then by √2, and re-ordering these scaled sums and differences in four possible arrangements with the appropriate sign changes. Table I summarizes the arithmetic for eight phase rotations on the unit circle.

TABLE I

| θ in radians | Re [e^jθ(Re A + j Im A)] | Im [e^jθ(Re A + j Im A)] |
|---|---|---|
| 0 | ReA | ImA |
| π/4 | √2(Re A − Im A) | √2(Re A + Im A) |
| 2π/4 | −Im A | Re A |
| 3π/4 | √2(−Re A − Im A) | √2(Re A + Im A) |
| 4π/4 | −Re A | −Im A |
| 5π/4 | √2(−Re A + Im A) | √2(−Re A − Im A) |
| 6π/4 | Im A | −Re A |
| 7π/4 | √2(Re A + Im A) | √2(−Re A + Im A) |

The combination of appropriately chosen references greatly simplifies the calculation of the partial log-likelihoods. For example, the r sample sum-of-products for each term is calculated only once. Each term, then reduced to a single complex value, assumes the real value or one of four rotations. This operation simply involves selecting either the real of imaginary value of the complex number and multiplying it by +1 or −1. The partial log-likelihoods are assigned as metrics to a 16 state trellis shown in FIG. 2. Four paths with unique metrics enter each state. Four paths with unique metrics also originate at each state. For example, a channel having a multipath spread of three symbols values affect each partial log-likelihood window. Viterbi decoding is applied to the trellis to determine the path with the largest accumulated partial log likelihood. Starting with the state in the last symbol instant of the interval having the largest accumulated partial log-likelihood, a path is traced back to reveal the most likely symbol sequence for the interval by decoding a symbol at each symbol instant in the traceback operation. The symbol sequence is then converted to differential symbol values for final DQPSK bit detection.

Figure 5:
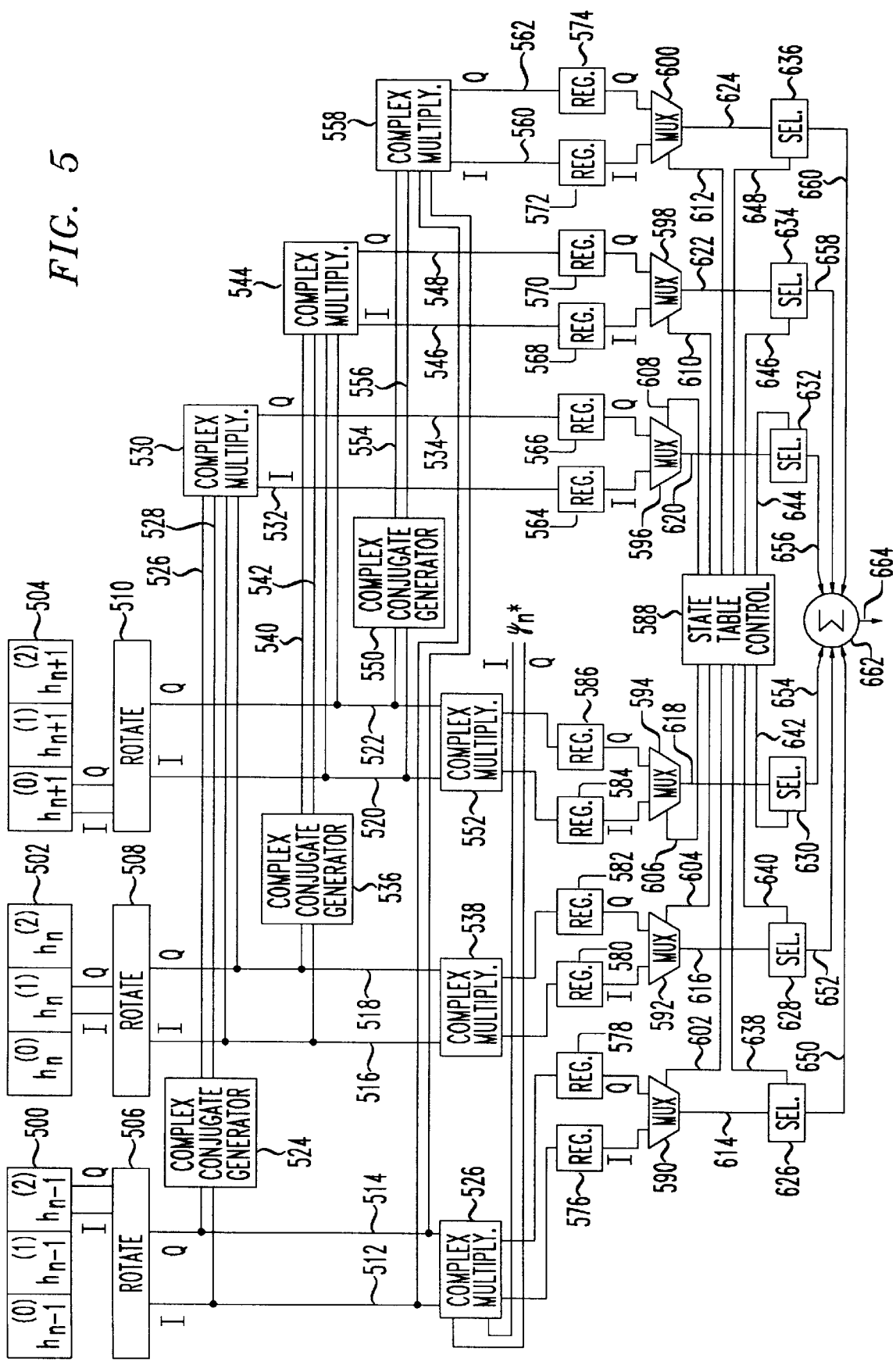
FIG. 5 is a block diagram of a circuit for calculating branch metrics in a viterbi decoder, using reduced computations in accordance with the present invention.

A circuit useful in generating the 64 partial log likelihood values, which are referred to as incremental metrics or branch metrics, for each symbol instant employing equation (2) in accordance with the invention is shown in FIG. 5. For a channel impulse response having three terms, that is a channel filter having three taps, and one sample per symbol, in equation (2) r=1, i=N and I=N.

The past and present channel estimates, as well as an approximation of a future channel estimate are provided at 500, 502 and 504. At each symbol instant, the reconstructed symbol is created for a single integration window. The 64 incremental metrics are developed from the integration window. The three taps of the channel impulse response are provided in each of blocks 500, 502 and 504. Both the in-phase, I, and quadrature, Q, components of a different one of the channel impulse response taps provides an input to each rotate block. In a preferred embodiment, the odd indexed channel estimates are rotated back by π/4, in respective rotate blocks 506, 508 and 510, to provide an expected value at 0, 2π/4, etc. Rotation is accomplished by substitution using TABLE I. Since only the odd channel estimates are rotated, at one symbol instant ROTATE blocks 506 and 510 will rotate channel estimates, and at previous and subsequent symbol instants only ROTATE block 508 will rotate the channel estimate.

Each rotate block generates in-phase and quadrature outputs of the partial response. Outputs 512 and 514 from rotate block 506 are provided to both complex conjugate generator 524 and complex multiply 526. Complex conjugate generator 524 produces the complex conjugate of its inputs 512 and 514 as its outputs 526 and 528 and provides the outputs as two inputs to complex multiply 530. The other two inputs to complex multiply 530 are outputs 516 and 518 from rotate block 508. Complex multiply 530 computes the complex product of its inputs and provides in-phase and quadrature outputs 532 and 534, which are stored in registers 564 and 566.

Outputs 516 and 518 from rotate block 508 are provided to both complex conjugate generator 536 and to complex multiply 538. The complex conjugate of inputs 516 and 518 are provided as outputs 540 and 542 from complex conjugate generator 536 which are two inputs to complex multiply 544. The other two inputs to complex multiply 544 are outputs 520 and 522 from rotate block 510. Complex multiply 544 computes the complex product of its inputs and provides in-phase and quadrature outputs 546 and 548 which are stored in registers 568 and 570.

Outputs 520 and 522 from rotate block 510 are provided to both complex conjugate generator 550 and to complex multiply 552. The complex conjugate of inputs 520 and 522 are provided as outputs 554 and 556 from complex conjugate generator 550 which are two inputs to complex multiply 558. The other two inputs to complex multiply 558 are outputs 512 and 514 from rotate block 506. Complex multiply 558 computes the complex product of its inputs and provides in-phase and quadrature outputs 560 and 562 which are stored in registers 572 and 574.

Complex multiplys 526, 538 and 552 each multiply the inputs from respective rotate blocks by sampled received signal $y_n^*$, and respectively store the complex product in registers 576 and 578, 580 and 582, and 584 and 586.

The complex multiply function represented by complex multiply blocks 526, 530, 538, 544, 552 and 558 can be performed by a single multiplier. Similarly, other functions represented in FIG. 5 need not be performed by separate hardware.

State table control 588, shown in Table II, controls multiplexers 590–600 by select inputs 602–612. Each multiplexer output 614–624 is provided to a respective selector 626–636. Selectors 626–636 are also controlled by state table control 588 by select inputs 638–648. Each selector 626–636 provides an output 650–660 to adder 662 which adds each of the inputs to produce output 664.

| Metric Counter | S (n − 1) | S (n) | S (n + 1) | $T_1$ | $T_2$ | $T_3$ | $T_4$ | $T_5$ | $T_6$ |
|---|---|---|---|---|---|---|---|---|---|
| 0 | 0 | 0 | 0 | +I | +I | +I | +I | +I | +I |
| 1 | 0 | 0 | 1 | +I | +I | −Q | +I | −Q | −Q |
| 2 | 0 | 0 | 2 | +I | +I | −I | +I | −I | −I |
| 3 | 0 | 0 | 3 | +I | +I | +Q | +I | +Q | +Q |
| 4 | 0 | 1 | 0 | +I | −Q | +I | −Q | +I | +Q |
| 5 | 0 | 1 | 1 | +I | −Q | −Q | −Q | −Q | +I |
| 6 | 0 | 1 | 2 | +I | −Q | −I | −Q | −I | −Q |
| 7 | 0 | 1 | 3 | +I | −Q | +Q | −Q | +Q | −I |
| 8 | 0 | 2 | 0 | +I | −I | +I | −I | +I | −I |
| 9 | 0 | 2 | 1 | +I | −I | −Q | −I | −Q | +Q |
| 10 | 0 | 2 | 2 | +I | −I | −I | −I | −I | +I |
| 11 | 0 | 2 | 3 | +I | −I | +Q | −I | +Q | −Q |
| 12 | 0 | 3 | 0 | +I | +Q | +I | +Q | +I | −Q |
| 13 | 0 | 3 | 1 | +I | +Q | −Q | +Q | −Q | −I |
| 14 | 0 | 3 | 2 | +I | +Q | −I | +Q | −I | +Q |
| 15 | 0 | 3 | 3 | +I | +Q | +Q | +Q | +Q | +I |
| 16 | 1 | 0 | 0 | −Q | +I | +I | +Q | +I | +Q |
| 17 | 1 | 0 | 1 | −Q | +I | −Q | +Q | +I | −Q |
| 18 | 1 | 0 | 2 | −Q | +I | −I | +Q | −Q | −I |
| 19 | 1 | 0 | 3 | −Q | +I | +Q | +Q | −I | +Q |
| 20 | 1 | 1 | 0 | −Q | −Q | +I | +I | +Q | +Q |
| 21 | 1 | 1 | 1 | −Q | −Q | −Q | +I | +I | −I |
| 22 | 1 | 1 | 2 | −Q | −Q | −I | +I | −Q | −Q |
| 23 | 1 | 1 | 3 | −Q | −Q | +Q | +I | −I | −I |
| 24 | 1 | 2 | 0 | −Q | −I | +I | −Q | +Q | −I |
| 25 | 1 | 2 | 1 | −Q | −I | −Q | −Q | +I | +Q |
| 26 | 1 | 2 | 2 | −Q | −I | −I | −Q | −Q | +I |
| 27 | 1 | 2 | 3 | −Q | −I | +Q | −Q | −I | −Q |
| 28 | 1 | 3 | 0 | −Q | +Q | +I | −I | +Q | −Q |
| 29 | 1 | 3 | 1 | −Q | +Q | −Q | −I | +I | −I |
| 30 | 1 | 3 | 2 | −Q | +Q | −I | −I | −Q | +Q |
| 31 | 1 | 3 | 3 | −Q | +Q | +Q | −I | −I | +I |
| 32 | 2 | 0 | 0 | −I | +I | +I | −I | −I | +I |
| 33 | 2 | 0 | 1 | −I | +I | −Q | −I | +Q | −Q |
| 34 | 2 | 0 | 2 | −I | +I | −I | −I | +I | −I |
| 35 | 2 | 0 | 3 | −I | +I | +Q | −I | +Q | +Q |
| 36 | 2 | 1 | 0 | −I | −Q | +I | +Q | −I | +Q |
| 37 | 2 | 1 | 1 | −I | −Q | −Q | +Q | +Q | +I |
| 38 | 2 | 1 | 2 | −I | −Q | −I | +Q | +I | −Q |
| 39 | 2 | 1 | 3 | −I | −Q | +Q | +Q | −Q | −I |
| 40 | 2 | 2 | 0 | −I | −I | +I | +I | −I | −I |
| 41 | 2 | 2 | 1 | −I | −I | −Q | +I | +Q | +Q |
| 42 | 2 | 2 | 2 | −I | −I | −I | +I | +I | +I |
| 43 | 2 | 2 | 3 | −I | −I | +Q | +I | −Q | −Q |
| 44 | 2 | 3 | 0 | −I | +Q | +I | −Q | −I | −Q |
| 45 | 2 | 3 | 1 | −I | +Q | −Q | −Q | +Q | −I |
| 46 | 2 | 3 | 2 | −I | +Q | −I | −Q | +I | +Q |
| 47 | 2 | 3 | 3 | −I | +Q | +Q | −Q | −Q | +I |
| 48 | 3 | 0 | 0 | +Q | +I | +I | −Q | −Q | +I |
| 49 | 3 | 0 | 1 | +Q | +I | −Q | −Q | −I | −Q |
| 50 | 3 | 0 | 2 | +Q | +I | −I | −Q | +Q | −I |
| 51 | 3 | 0 | 3 | +Q | +I | +Q | −Q | +I | +Q |
| 52 | 3 | 1 | 0 | +Q | −Q | +I | −I | −Q | +Q |
| 53 | 3 | 1 | 1 | +Q | −Q | −Q | −I | −I | +I |
| 54 | 3 | 1 | 2 | +Q | −Q | −Q | −I | −I | +I |
| 55 | 3 | 1 | 3 | +Q | −Q | +Q | −I | +I | −I |
| 56 | 3 | 2 | 0 | +Q | −I | +I | −Q | −Q | −I |
| 57 | 3 | 2 | 1 | +Q | −I | −Q | +Q | −I | +Q |
| 58 | 3 | 2 | 2 | +Q | −I | −I | +Q | +Q | +I |
| 59 | 3 | 2 | 3 | +Q | −I | +Q | +Q | +I | −Q |
| 60 | 3 | 3 | 0 | +Q | +Q | +I | +I | −Q | −Q |
| 61 | 3 | 3 | 1 | +Q | +Q | −Q | +I | −I | −I |
| 62 | 3 | 3 | 2 | +Q | +Q | −I | +I | +Q | +Q |
| 63 | 3 | 3 | 3 | +Q | +Q | +Q | +I | +I | +I |

The control of multiplexers 590–600 and selectors 626–636 is represented in Table II. The first column is the metric counter. The second, third and fourth columns are the symbol indices. The six columns at the right represent the twelve controls 602–612 and 638–648. The I or Q in the first of the six right-most columns represents whether the in-phase or quadrature output from registers 576 or 578 is selected as the input to multiplexer 590. The sign preceding the entry in the first of the six right-most columns represents whether the selector 626 selects the output of the multiplexer taken as positive for a +, or inverted for a −. The other five of the six right-most columns each control one of the other multiplexer-selector combinations.

Figure 3:
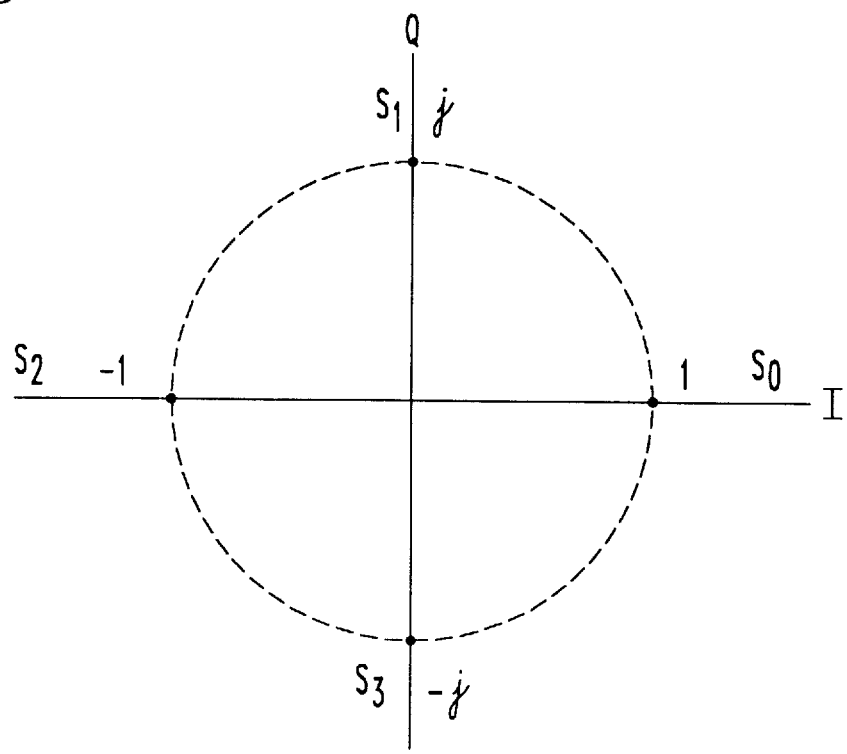
FIG. 3 is a graphical representation of an odd symbol phase constellation for $\pi/4$-shifted differentially encoded quadrature phase shift keying.
Figure 4:
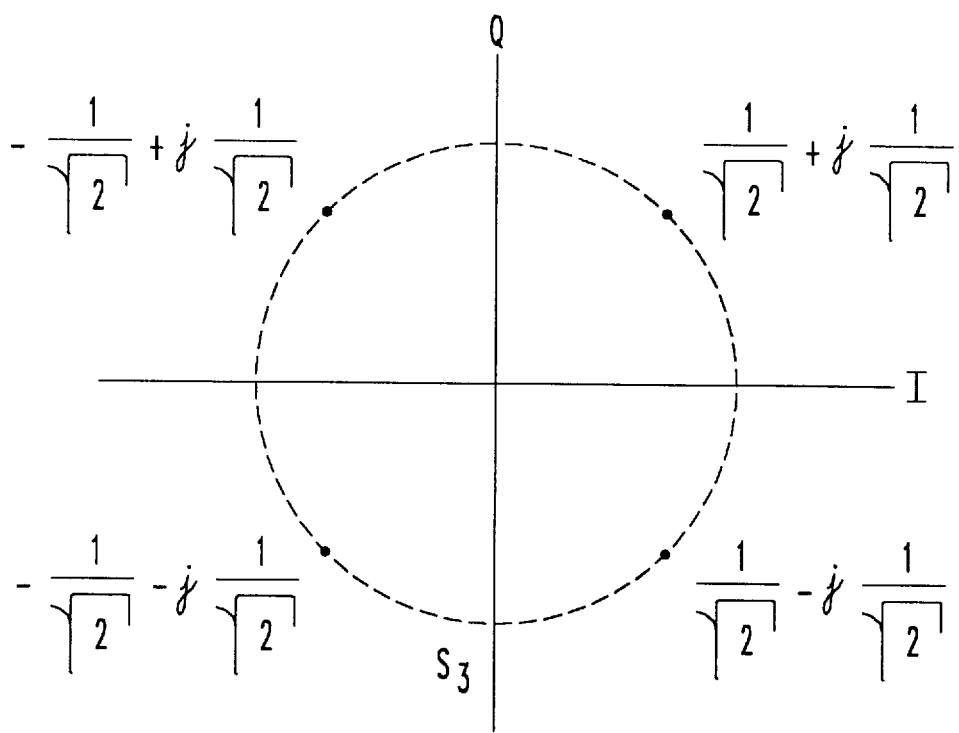
FIG. 4 is a graphical representation of an even symbol phase constellation for $\pi/4$-shifted differentially encoded quadrature phase shift keying.

The control information in the six right-most columns of Table II to control multiplexers 590–600 and selectors 626–636 can be stored in an array with each branch metric requiring only twelve control bits, two for each term of equation (2). The data in Table II is generated from the constellation of FIG. 3, the $0, \pi/4, 2\pi/4$ rotations in Table I, and the real part of the possible symbol product combinations of $S_1^* S_2$. Each factor of each partial response in the auto correlation is constructed by a one of the symbol values times a channel estimate.

In accordance with the invention, components of the cross correlation terms auto correlation terms of a group of branch metrics at a symbol instant are calculated once and stored in respective registers 564–586. Selective ones of the components of the cross correlation terms and auto correlation terms are combined by multiplexers 590–600 and selectors 626–636 to form the cross correlation terms and auto correlation terms. State table control 588 determines which components from registers 564–586 are combined and whether the components are positive or negative. Outputs 650, 652 and 654 are the cross correlation terms in equation (2) and outputs 656, 658 and 660 are the autocorrelation terms in equation (2). Adder 662 combines the cross correlation terms and auto correlation terms to produce a branch metric as output 664. The metric counter is incremented and another branch metric is generated from the components stored in registers 564–586. This process continues until all of the branch metrics are generated that are based on the components stored in registers 564–586. Typically, the branch metrics for all branches into states at a symbol instant are calculated based on the components stored in registers 564–586. The channel impulse response in blocks 500, 502 and 504 are updated as is $y_n^*$ representing the next symbol instant. Updated components are calculated and stored in registers 564–586, such as by overwriting. The branch metrics for the updated symbol instant are then computed in the above manner. The process is repeated for all symbol instants represented by the received data. Other aspects of the viterbi decoding, including traceback operations and determining final decoded symbols may be done in any known manner.

Once the calculations are updated and stored in registers 564–586, 64 branch metrics are produced as various combinations of the values stored in registers 564–586. By stepping through the 64 controls of state table control 588, 64 branch metrics are produced at output 664, one at a time. Calculations are updated for the next symbol instant, and 64, branch metrics at the new symbol instant are calculated.

There are six terms in equation (2). The number of terms in equation (2) is independent of the value of r, the number of samples per symbol. Thus, the number of registers 564–586 will remain the same regardless of the number of samples per symbol.

For GSM applications, the circuit of FIG. 5 can be simplified. The simplification is possible because the expected values of received signals take on only two real values. One of the ways the circuit of FIG. 5 is simplified is that multiplexers 590–600 are not required.

Table III is a tabulation of the number of operations required to calculate branch metrics on a per symbol basis using the Euclidean distance method. L represents the channel length, that is the number of taps in the channel impulse response, and r represents the number of samples per symbol.

TABLE III

| Operation | Adds/Symbol | Multiplies/Symbol |
|---|---|---|
| Combine complex channel impulse responses | $4 \cdot r \cdot 4^L$ | Not applicable |
| Calculate error vector | $2 \cdot r \cdot 4^L$ | Not applicable |
| Square error vectors | Not applicable | $2(4)^L$ |
| Combine squared error vectors | $4^L$ | Not applicable |
| Total | $(6 \cdot r + 1)4^L$ | $2(4)^L$ |

Table IV is a tabulation of the number of operations required to calculate branch metrics on a per symbol basis in accordance with the present invention.

TABLE IV

| Operation | Adds | Multiplies |
|---|---|---|
| Calculate cross correlation terms | $L(r - 1)$ | $4 \cdot r \cdot L$ |
| Calculate auto correlation terms | $(r-1)\left(\frac{L^2+L}{2} - L\right)$ | $4 \cdot r \cdot \left(\frac{L^2+L}{2} - L\right)$ |
| Combine rotated auto and cross correlation terms for $4^L$ metrics | $\left(\frac{L^2 L}{2} - 1\right) \cdot 4^L$ | Not applicable |
| TOTAL | $(r-1)\left(\frac{L^2+L}{2}\right) + \left(\frac{L^2+L}{2} - 1\right) \cdot 4^L$ | $4 \cdot r \cdot \left(\frac{L^2+L}{2}\right)$ |

The total number of operations to complete a metric calculation at one symbol instant for the 4-ary case using each method is tabulated in the bottom row of each table.

As compared to the Euclidean distance method, the computation and power savings of the present invention are beneficial up to about eight channel impulse response taps at one sample per symbol. The savings increase for multiple samples per symbol, and thus the present invention becomes more advantageous even with a greater number of taps in the channel impulse response. Even where the number of operations are about the same for the two methods compared in Tables III and IV, the power savings are greater for the present invention. Multiply operations consume approximately five times as much power as an odd operation using the same operands. The power savings are accomplished by performing relative few numbers of multiply operations and performing relative more add operations.

TABLE V

| Operation | Euclidean Method | | Reduced Metric Computation Method | |
|---|---|---|---|---|
| | Two Samples per Symbol | One Sample per Symbol | Two Samples per Symbol | One Sample per Symbol |
| Adds | 832 | 448 | 326 | 320 |
| Multiplies | 128 | 128 | 48 | 24 |
| Total operations | 960 | 576 | 374 | 344 |
| Energy Units Consumed | 1472 | 1088 | 566 | 440 |

Table V illustrates the savings in operations and power for the illustrated embodiment. An energy unit is that amount of energy consumed in an add operation. The branch metric operation is the most redundant operation in a receiver, thus power saved in each operation, here about 50% reduction, is a significant savings.

The invention is particularly useful in communication systems and equipment employing integrated circuits including this reduced computation technique. Such communication systems and equipment have the advantage of reduced complexity of circuitry to accomplish the signal processing. Furthermore, the reduced computation time reduces power consumption.

While the control of multiplexers 590–600 and selectors 626–636 has been described as being controlled by state table control 588, the invention is not limited thereto. The control bits can be generated in other ways, such as but not limited to a counter and logic circuitry, a control processing unit (CPU), a computer program, or stored in read-only-memory (ROM).

Although the invention has been described as useful in computing branch metrics, the invention is not limited thereto. The invention may also be used to calculate the difference between branch or path metrics entering each state. The branch or path metric differences can be used to calculate "soft metrics" for subsequent error correction decoding.

While the illustrative embodiment has been described as applicable to branch metric calculations for a trellis having a constraint length of C, the invention is also applicable to a "reduced constraint" trellis viterbi decoder.

While the illustrative embodiment of the invention has been described as useful in digital cellular telephony, the invention is not limited thereto. The invention is useful in any digital transmission and detection application employing forward error correction such a viterbi decoder. By way of example and not limitation, other applications include reading digital data from a disk or CD ROM, and communications between earth stations and satellites.

While the illustrative embodiment of the invention has not been described as incorporating pipelining, one skilled in the art would recognize the enhanced computation efficiency available by utilizing pipelining in the design. Pipelining is achieved by initiating computation with a new dataset before completing computation with a previous set of data. The more latches used in pipelining, the greater the depth of pipelining. Pipelining causes an initial latency in computation time required to fill the pipeline, but maximizes usage of resources.

The invention claimed is:

1. A method for determining a plurality of branch metrics at a symbol instant that are comprised of autocorrelation terms and cross correlation terms, including the steps of generating components of the autocorrelation terms, storing the components of the autocorrelation terms, generating components of the cross correlation terms, storing the components of the cross correlation terms, characterized by:

selecting predetermined ones of the autocorrelation components and the cross correlation components, and combining the selected autocorrelation components and cross correlation components in a predetermined manner to produce a branch metric.

2. The method as recited in claim 1, further characterized the step of:

repeating the selecting and combining steps to produce another branch metric.

3. An integrated circuit including a branch metric calculation circuit, comprising:

a circuit for generating components of autocorrelation terms;

at least one register for receiving and storing components of the autocorrelation terms;

a circuit for generating components of cross correlation terms;

at least one register for receiving and storing components of the cross correlation terms;

a selection circuit for selecting predetermined ones of the autocorrelation components and the cross correlation components stored in said at least one registers;

a selective inverter circuit for selectively inverting predetermined ones of the selected auto correlation components and cross correlation components; and a combining circuit for receiving the selected auto correlation components and cross correlation components and for combining the selected autocorrelation components and cross correlation components to produce a branch metric.

4. The integrated circuit as recited in claim 3, wherein the selection circuit includes a look-up table.

5. The integrated circuit as recited in claim 3, wherein the combining circuit is an adder.

6. The integrated circuit as recited in claim 3 wherein the selective inverter circuit provides as an output a positive or a negative version of the input depending upon a control select input.

7. The integrated circuit as recited in claim 3, wherein the selection circuit selects all of the autocorrelation components and all of the cross correlation components.

8. The integrated circuit as recited in claim 3 further comprising at least one rotate circuit.

9. An integrated circuit comprising:

a circuit for generating components of autocorrelation terms;

a circuit for generating components of cross correlation terms;

a circuit for combining autocorrelation components and cross correlation components;

at least two registers for receiving and storing components of the autocorrelation terms;

at least two registers for receiving and storing components of the cross correlation terms;

a selection circuit for selecting predetermined ones of the autocorrelation components and the cross correlation components stored in said at least two registers;

a selective circuit for selectively inverting predetermined ones of the selected auto correlation components and cross correlation components; and a combining circuit for receiving the selected auto correlation components and cross correlation components and for combining the selected autocorrelation components and cross correlation components to produce a branch metric.

10. The integrated circuit as recited in claim 9, wherein the selection circuit includes a look-up table.

11. The integrated circuit as recited in claim 9, wherein the combining circuit is an adder.

12. The integrated circuit as recited in claim 9, wherein the selective inverter circuit provides as an output positive or a negative version of the input depending upon a control select input.

13. The integrated circuit as recited in claim 9, wherein the selection circuit selects all of the autocorrelation components and all of the cross correlation components.

14. The integrated circuit as recited in claim 9, further comprising at least one rotate circuit.

15. A receiver, comprising:

a circuit for generating components of autocorrelation terms;

at least one register for receiving and storing components of the autocorrelation terms;

a circuit for generating components of cross correlation terms;

at least one register for receiving and storing components of the cross correlation terms;

a selection circuit for selecting predetermined ones of the autocorrelation components and the cross correlation components stored in said at least one registers, a selective inverter circuit for selectively inverting predetermined ones of the selected auto correlation components and cross correlation components; and a combining circuit for receiving the selected auto correlation components and cross correlation components and for combining the selected autocorrelation components and cross correlation components to produce a branch metric.

16. A receiver as recited in claim 15, wherein the selection circuit includes a look-up table.

17. A receiver as recited in claim 15, wherein the combining circuit is an adder.

18. A receiver as recited in claim 15 wherein the selective inverter circuit provides as an output a positive or a negative version of the input depending upon a control select input.

19. A receiver as recited in claim 15, wherein the selection circuit selects all of the autocorrelation components and all of the cross correlation components.

20. A receiver as recited in any of claim 15, further comprising at least one rotate circuit.

21. A receiver as recited in claim 15, further comprising a transmitter.

* * * * *